United States Patent [19]
Saito et al.

[11] Patent Number: 4,772,927
[45] Date of Patent: Sep. 20, 1988

[54] THIN FILM FET DOPED WITH DIFFUSION INHIBITOR

[75] Inventors: Ryuichi Saito; Naohiro Momma, both of Hitachi, Japan

[73] Assignee: Hitachi, Ltd., Tokyo, Japan

[21] Appl. No.: 922,347

[22] Filed: Oct. 23, 1986

[30] Foreign Application Priority Data

Oct. 23, 1985 [JP] Japan ................................. 60-235241
Dec. 23, 1985 [JP] Japan ................................. 60-287750

[51] Int. Cl.$^4$ .................. H01L 29/78; H01L 29/167; H01L 29/04
[52] U.S. Cl. ..................................... 357/23.7; 357/63; 357/64; 357/59; 357/42; 437/21; 437/24
[58] Field of Search ................ 357/23.7, 23.1, 59, 357/63, 64, 42; 437/21, 24

[56] References Cited

U.S. PATENT DOCUMENTS 4,380,773  4/1983  Goodman ..................... 357/59 G
4,420,870 12/1983  Kimura ........................ 357/23.7
4,689,667  8/1987  Aronowitz .................... 357/63

FOREIGN PATENT DOCUMENTS 0073075  3/1983  European Pat. Off. ............ 357/63
3317954 11/1983  Fed. Rep. of Germany ....... 357/63

OTHER PUBLICATIONS

Ng et al., IEEE Electron Device Letters, vol. EDL-2, No. 12, Dec. 1981, pp. 316-318.

Primary Examiner—Andrew J. James
Assistant Examiner—John Lamont
Attorney, Agent, or Firm—Antonelli, Terry & Wands

[57] ABSTRACT

The present invention relates to a semiconductor device including a MOS transistor which is formed with a source region, a drain region and a channel region by the use of polycrystalline silicon, and a method of manufacturing the semiconductor device. Ions of carbon, oxygen or/and nitrogen are introduced into a polycrystalline silicon layer over the whole area thereof, and restrain conductive ions in the source and drain regions from diffusing into the channel region.

11 Claims, 2 Drawing Sheets

THIN FILM FET DOPED WITH DIFFUSION INHIBITOR

BACKGROUND OF THE INVENTION

The present invention relates to a semiconductor device and a method of manufacturing the same. More particularly, it relates to a semiconductor device including a MOS transistor element which is formed using polycrystalline silicon well-suited to microminiaturize geometries, to heighten available percentage and to reduce dispersions, and a method of manufacturing the same.

A MOS transistor element formed using polycrystalline silicon is discussed in IEEE, Trans. on Electron Device ED-32, No. 2 (1985), pp. 258–281. Herein, a structure in which the polycrystalline-silicon MOS transistor element is stacked and formed on an insulator film or a transistor element formed on a single-crystal semiconductor substrate is employed in order to raise the density of integration of a semiconductor integrated circuit and to attain electrical isolation. The source and drain regions of the polycrystalline-silicon MOS transistor element are formed by introducing a conductive impurity (e.g., phosphorus, arsenic or antimony for an NMOS transistor, and e.g., boron, aluminum or gallium for a PMOS transistor) into the polycrystalline silicon.

The prior art does not take it into consideration that the diffusion of the conductive impurity passing through grain boundaries in the polycrystalline silicon is very fast. Since the diffusion of the impurity in the polycrystalline silicon is fast, extensive lateral diffusion is caused by annealing. As a result, in a case where the interval between the regions into which the conductive impurity is introduced is narrow, the source region and the drain region are sometimes joined together. This poses the problem that the polycrystalline-silicon MOS transistor element of minute geometries having a gate length less than about 2 $\mu$m cannot be formed.

A method for solving such a problem is disclosed in the official gazette of Japanese Kokai Patent Publication No. 55-82458 (1980). Proposed in this patent publication is a method which forms a polycrystalline-silicon high resistance of minute geometries by exploiting the fact that, when oxygen or nitrogen is introduced into a high resistance portion of polycrystalline silicon by ion implantation, the property of the polycrystalline silicon changes to give rise to a diffusion suppressing effect, so the lateral diffusion is reduced. More concretely, only a region which forms a channel region between the source region and drain region of a MOS transistor is implanted with the oxygen or nitrogen ions, thereby to suppress the diffusion of the conductive impurity in the implanted region, with the intention of preventing the channel region from narrowing. This prior-art method, however, does not take into consideration the decrease of the diffusion suppressing effect at the edge of the channel region, namely, the region implanted with the oxygen or nitrogen ions, and the occurrence of cracks etc. attributed to the discontinuity of the edge. More specifically, the edge of the region implanted with, e.g., the oxygen is always supplied with the conductive impurity from the electrode region existing continuously to the high resistance portion, so that the conductive impurity concentration of the edge during annealing does not lower even when the impurity is diffused into the high resistance portion. Accordingly, the diffusion suppressing effect of the oxygen-implanted region is not attained efficiently, and the length of the lateral diffusion extending from the edge of the oxygen-implanted region into the high resistance region is not reduced sufficiently. On the other hand, in a case where the dose of oxygen is set at $10^{16}$ cm$^{-2}$ or above to the end of rendering the diffusion suppressing effect sufficient, the density of the oxygen amounts to above several % of the density of silicon, so that the expansion of the volume of the polycrystalline silicon and the change of the crystalline state thereof take place. Therefore, a stress acts on the edge of the oxygen-implanted region and the discontinuity such as cracks arises, so that defects of the high-resistance polycrystalline silicon or dispersion of resistance values develops.

SUMMARY OF THE INVENTION

The first object of the present invention is to sufficiently reduce the lateral diffusion of a conductive impurity in polycrystalline silicon, and to provide a semiconductor device which is well suited to form polycrystalline-silicon MOS transistor elements of high available percentage and small dispersions even when geometries are microminiaturized, as well as a method of manufacturing the semiconductor device.

The second object of the present invention is to provide a semiconductor device having a MOS transistor element employing polycrystalline silicon for a source region, a drain region and a channel region and a method of manufacturing the semiconductor device, in which a conductive impurity contained in the polycrystalline silicon and serving to form the source and drain regions is restrained from diffusing laterally, especially to the channel region, during annealing.

The first characterizing feature of the present invention consists in a semiconductor device having a MOS transistor element which is formed with a source region, a drain region and a channel region in a polycrystalline silicon layer on a semiconductor body, comprising the fact that said source region, drain region and channel region are all formed of polycrystalline silicon, that a conductive impurity is contained in said source region and drain region, and that at least one species of ions selected from the group consisting of oxygen, nitrogen and carbon ions are contained in said source region, drain region and channel region in order to restrain said conductive impurity from diffusing into said channel region.

The second characterizing feature of the present invention consists in a method of manufacturing a semiconductor device having a MOS transistor element which is formed with a source region, a drain region and a channel region in a polycrystalline silicon layer on a semiconductor body, comprising at least:

(a) the step of introducing at least one species of ions selected from the group consisting of oxygen, nitrogen and carbon ions, into a whole area of said polycrystalline silicon layer.

The third characterizing feature of the present invention consists in a method of manufacturing a semiconductor device having a MOS transistor element which is formed with a source region, a drain region and a channel region in a polycrystalline silicon layer on a semiconductor body, comprising at least:

(a) the step of introducing at least one species of ions selected from the group consisting of oxygen, nitrogen and carbon ions, into a whole area of said polycrystalline silicon layer, (b) the step of introducing conductive impurity ions into respective regions which are to become said source region and drain region, and (c) the step of annealing the polycrystalline silicon layer which contains said ions introduced at said steps (a) and (b).

According to the present invention, at least one element among oxygen, nitrogen and carbon is introduced into the whole polycrystalline silicon layer, whereby the physical properties of polycrystalline silicon change. In particular, the grain boundaries of the polycrystalline silicon are partly formed with silicon oxide, silicon nitride or silicon carbide, whereby the physical properties of the grain boundaries change so as to suppress the diffusion of an impurity passing through the grain boundaries. Thus, the lateral diffusion in the polycrystalline silicon is reduced, so that a polycrystalline-silicon MOS transistor element of minute geometries can be formed. Moreover, since the diffusion rate is low, the dispersions are small and the available percentage becomes high.

Besides, in the present invention, preferably at least one element among oxygen, nitrogen and carbon is contained at a low concentration in the vicinity of a polycrystalline silicon - insulator film interface in which the channel of the polycrystalline-silicon MOS transistor element is formed, in order to prevent the threshold voltage from increasing, and it is contained at a higher concentration in the other regions. Also, preferably the concentration of at least one element among oxygen, nitrogen and carbon is set within a range of $10^{19}$–$10^{22}$ atoms/cm$^3$.

DETAILED DESCRIPTION OF THE PREFERRED EMBODIMENTS

Now, embodiments of the present invention will be described with reference to the drawings.

Figure 1:
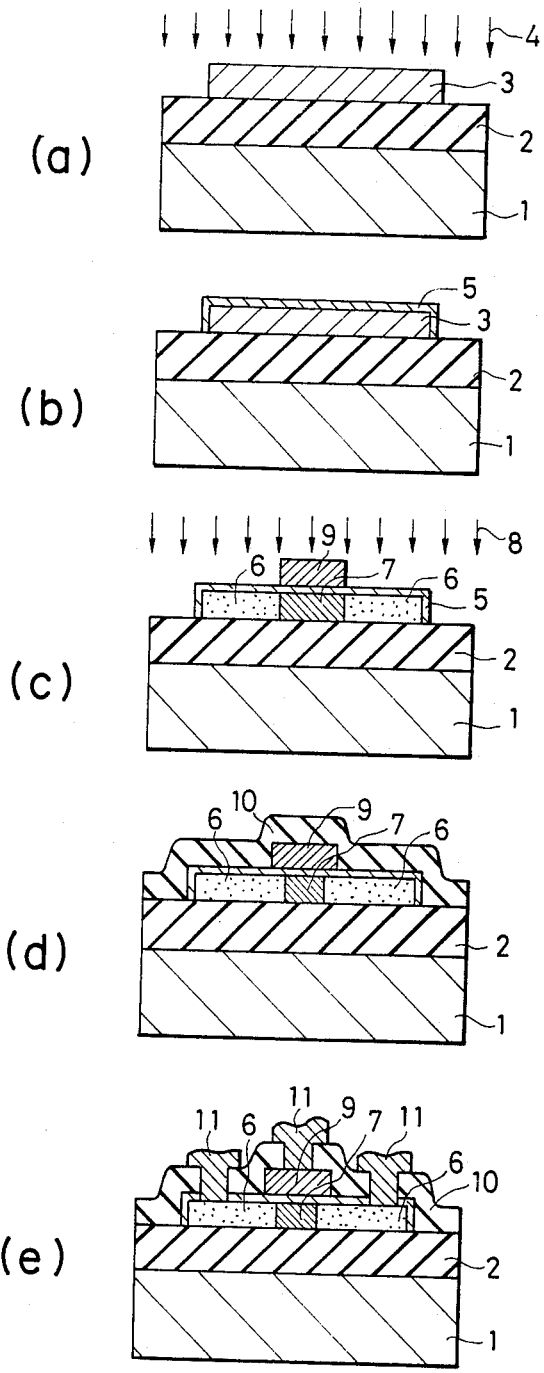
FIGS. 1(a)–1(e) illustrate an embodiment of the present invention, and are views showing a manufacturing process for a semiconductor device which includes a MOS transistor polycrystalline silicon.

FIGS. 1(a)–1(e) illustrate one embodiment of the present invention. First, as shown in FIG. 1(a), an insulator film 2 is deposited on a semiconductor substrate or semiconductor element 1, and a polycrystalline silicon layer 3 is further deposited using the low-pressure CVD process by way of example. Using an ordinary photoetching method, the polycrystalline silicon layer 3 is etched into the shape of an island as an element forming region. Subsequently, ions of, e.g., oxygen 4 are introduced into the polycrystalline silicon 3 by the use of the ion implantation process. Here, the ion implantation of the oxygen ions 4 may well be performed before the etching of the polycrystalline silicon 3. Implanting conditions are set in consideration of the thickness of the polycrystalline silicon 3 so that the oxygen may be introduced into the whole polycrystalline silicon layer 3. The concentration of the introduced oxygen is preferably set within a range of $10^{19}$–$10^{22}$ atoms/cm$^3$. Also preferably, the oxygen concentration of a channel region, namely, the vicinity of the upper surface of the polycrystalline silicon layer 3 is set at a low concentration, for example, $10^{20}$ atoms/cm$^3$ or less. Thus, the increase of the threshold voltage ascribable to the introduction of the oxygen is checked. Next, as shown in FIG. 1(b), a gate insulator film 5 is formed by thermally oxidizing the resultant structure or depositing an insulator film. Subsequently, as shown in FIG. 1(c), the gate electrode 9 of a polycrystalline-silicon MOS transistor element is formed, and the ions of a conductive impurity 8 are introduced by the ion implantation process so as to form diffused layers 6 which are to become source and drain regions. Next, an insulator film 10 is deposited as shown in FIG. 1(d), and the resultant structure is annealed. On this occasion, the lateral diffusion of the conductive impurity in the diffused layers 6 is suppressed owing to the oxygen contained. Thus, even when the width of the gate electrode 9 is 2 μm or less, for example, 0.8 μm, the diffused layers 6 do not join together and the conductive impurity is not diffused into the whole channel region 7. Next, as shown in FIG. 1(e), contact holes are formed in the insulator film 10, and electrodes of, e.g., Al 11 are formed. Then, the polycrystalline-silicon MOS transistor element of minute geometries is formed.

In the above, the introduction of oxygen may well be performed by a method in which the polycrystalline silicon is doped with oxygen at the deposition thereof. The inventors have found out that similar suppression of the impurity diffusion is brought forth by introducing nitrogen or carbon otherwise than the oxygen.

Figure 2:
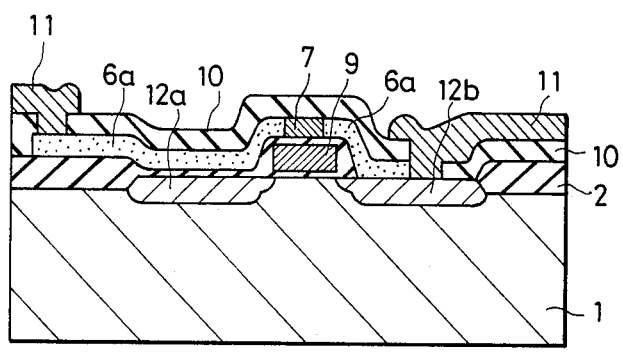
FIG. 2 is a view showing another embodiment of the present invention.

FIG. 2 shows a CMOS device of stacked structure as another embodiment of the present invention. An N-channel MOS transistor element is formed by forming N-type diffused layers 12a and 12b and a gate electrode 9 on a semiconductor substrate 1, whereupon this element is overlaid with a polycrystalline-silicon MOS transistor element which contains, e.g., oxygen within a concentration range of $10^{19}$–$10^{22}$ atoms/cm$^3$. The diffused layers 6a and 6b of the polycrystalline-silicon MOS transistor element are doped with a P-type impurity, and the polycrystalline-silicon P-channel MOS transistor element which shares the gate electrode 9 with the N-channel MOS transistor is formed. Here, preferably the concentration of the oxygen in the vicinity of the lower surface of the polycrystalline silicon layer is set low. The drain of the N-channel MOS transistor element and the source of the polycrystalline-silicon P-channel MOS transistor element are connected. Thus, the CMOS device of the stacked structure is formed.

Figure 3:
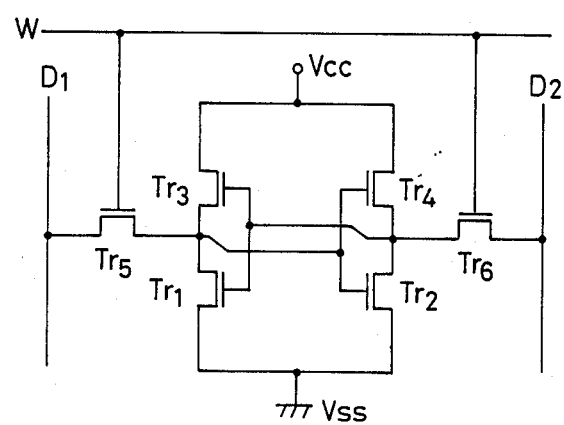
FIG. 3 is a circuit diagram of a static operation type flip-flop memory cell which is formed by the use of CMOS elements as shown in FIG. 2.

FIG. 3 shows a circuit diagram of a static operation type flip-flop memory cell which is formed of CMOS elements as shown in FIG. 2. Symbols $Tr_1$, $Tr_2$, $Tr_5$ and $Tr_6$ denote the N-channel MOS transistors, and symbols $Tr_3$ and $Tr_4$ the polycrystalline-silicon P-channel MOS transistors. The transistors $Tr_5$ and $Tr_6$ are transfer MOS transistors, which connect respective bit lines $D_1$ and $D_2$ with the memory cell in accordance with the potential change of a word line W. The transistors $Tr_3$ and $Tr_4$ are respectively stacked and formed on the transistors $Tr_1$ and $Tr_2$ as shown in FIG. 2, and serve as the load MOS transistors of the respective transistors $Tr_1$ and $Tr_2$. They form current paths from a power supply terminal $V_{cc}$ to a ground terminal $V_{ss}$ so as to establish a bistable state. Here, since oxygen, for example, is contained in the polycrystalline-silicon PMOS transistors $Tr_3$ and $Tr_4$, the geometries of these transistors $Tr_3$ and $Tr_4$ can be rendered as minute as those of the transistors Tr$_1$ and Tr$_2$. This makes it possible to integrate the memory cells at a higher packing density.

As the MOS transistors, the present invention is applicable to ones of the structures of PNP, NPN, N+NN+ and P+PP+. In addition, as the impurity introduction, not only the ion implantation but also various known introducing methods such as the diffusion process can be employed.

What is claimed is:

1. A semiconductor device having a MOS transistor element which is formed with a source region, a drain region and a channel region in a polycrystalline silicon layer on a semiconductor body, characterized in that said source region, drain region and channel region are all formed of polycrystalline silicon, that a conductive impurity is contained in said source region and drain region, and that at least one species of ions selected from the group consisting of oxygen, nitrogen and carbon ions are contained in said source region, drain region and channel region in order to restrain said conductive impurity from diffusing into said channel region.

2. A semiconductor device as defined in claim 1, wherein the at least one species of ions selected from the group consisting of oxygen, nitrogen and carbon are contained in said source region, drain region and channel region such that the grain boundaries of the polycrystalline silicon respectively are partly formed with at least one of silicon oxide, silicon nitride and silicon carbide.

3. A semiconductor device as defined in claim 1, wherein the concentration of the at least one species of ions contained in said source region, drain region and channel region is $10^{19}$–$10^{22}$ atoms/cm$^3$.

4. A semiconductor device as defined in claim 1, wherein said at least one species of ions is contained at a relatively low concentration in the channel region and a relatively high concentration in the source and drain regions as compared to the concentration in the channel region.

5. A semiconductor device as defined in claim 4, wherein the concentration of the at least one species of ions contained in the channel region is $10^{19}$–$10^{20}$ atoms/cm$^3$, the concentration of the at least one species of ions contained in the source and drain regions being $10^{19}$–$10^{22}$ atoms/cm$^3$.

6. A semiconductor device as defined in claim 1, the device further including a gate electrode, spaced from the channel region in the polycrystalline silicon layer via a gate insulating film.

7. A semiconductor device as defined in claim 6, wherein said gate electrode has a width of at most 2 μm.

8. A semiconductor device as defined in claim 6, wherein said semiconductor body has source and drain regions formed therein, with a channel region formed in the semiconductor body extending between the source and drain regions, the device further comprising a gate electrode spaced via a gate insulating film from the channel region in the semiconductor body.

9. A semiconductor device as defined in claim 8, wherein the gate electrode spaced from the channel region in the semiconductor body and the gate electrode spaced from the channel region in the polycrystalline silicon film is a common gate electrode, extending between said semiconductor body and said polycrystalline silicon film.

10. A semiconductor device as defined in claim 8, wherein the conductive impurity contained in the source and drain regions in the polycrystalline silicon layer are of a first conductivity type, and the source and drain regions formed in the semiconductor body contain a conductive impurity of a second conductivity type opposite the first conductivity type.

11. A semiconductor device as defined in claim 1, wherein all of said polycrystalline silicon layer contains said at least one species of ions.

* * * * *